United States Patent
Cheon et al.

(10) Patent No.: US 11,522,040 B2
(45) Date of Patent: *Dec. 6, 2022

(54) DISPLAY DRIVING CIRCUIT AND DISPLAY DEVICE INCLUDING THE SAME

(71) Applicant: Samsung Electronics Co., Ltd., Suwon-si (KR)

(72) Inventors: Seong Min Cheon, Hwaseong-si (KR); Dong Wook Suh, Bucheon-si (KR); Ji Hyun Lee, Gwangmyeong-si (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/359,860

(22) Filed: Jun. 28, 2021

(65) Prior Publication Data

US 2021/0327998 A1 Oct. 21, 2021

Related U.S. Application Data

(63) Continuation of application No. 16/731,235, filed on Dec. 31, 2019, now Pat. No. 11,069,767, which is a
(Continued)

(30) Foreign Application Priority Data

Oct. 31, 2017 (KR) .................. 10-2017-0143424
Dec. 29, 2017 (KR) .................. 10-2017-0183761

(51) Int. Cl.
*G09G 3/3258* (2016.01)
*G09G 3/20* (2006.01)
(Continued)

(52) U.S. Cl.
CPC ....... *H01L 27/3276* (2013.01); *G09G 3/2092* (2013.01); *G09G 3/3258* (2013.01);
(Continued)

(58) Field of Classification Search
None
See application file for complete search history.

(56) References Cited

U.S. PATENT DOCUMENTS 7,737,939 B2   6/2010   Shin et al.
8,330,754 B2  12/2012   Byun et al.
(Continued)

FOREIGN PATENT DOCUMENTS

KR        10-0752652 B1    8/2007
KR    10-2008-0087525 A   10/2008
(Continued)

OTHER PUBLICATIONS

Korean Office Action dated Jan. 30, 2022 for Application No. KR 10-2017-0183761.
(Continued)

*Primary Examiner* — Duane N Taylor, Jr.
(74) *Attorney, Agent, or Firm* — Harness, Dickey & Pierce, P.L.C.

(57) ABSTRACT

A display driving circuit and a display device including the same are provided. The display driving circuit includes a source driver which applies source data to a display panel, a power supply unit which receives an external voltage from a power module to generate an internal voltage and a logic unit which is supplied with the internal voltage to control the source driver, wherein the logic unit includes a voltage variable determination logic which determines whether a supply voltage including the internal voltage and the external voltage is changed, thereby generating a voltage variable signal, and a voltage control logic which receives the voltage variable signal to change the supply voltage.

20 Claims, 10 Drawing Sheets

Related U.S. Application Data continuation of application No. 15/984,782, filed on May 21, 2018, now Pat. No. 10,593,266.

(51) Int. Cl.
   *G09G 5/00*     (2006.01)
   *H01L 27/32*    (2006.01)

(52) U.S. Cl.
   CPC ..... *G09G 5/003* (2013.01); *G09G 2310/0243* (2013.01); *G09G 2310/0264* (2013.01); *G09G 2310/0291* (2013.01); *G09G 2310/08* (2013.01); *G09G 2330/021* (2013.01); *G09G 2330/028* (2013.01); *G09G 2370/08* (2013.01)

(56) References Cited

U.S. PATENT DOCUMENTS

| | | | |
|---|---|---|---|
| 9,161,411 B1 * | 10/2015 | Dunn | H05B 47/18 |
| 9,182,805 B2 | 11/2015 | Kim et al. | |
| 9,472,135 B2 | 10/2016 | Wen et al. | |
| 9,721,494 B2 | 8/2017 | Lee et al. | |
| 10,102,802 B2 * | 10/2018 | Kwon | G09G 3/3233 |
| 2008/0018569 A1 | 1/2008 | Sung et al. | |
| 2008/0106542 A1 | 5/2008 | Park et al. | |
| 2014/0354698 A1 * | 12/2014 | Lee | G09G 3/3258 |
| | | | 345/690 |
| 2015/0348496 A1 | 12/2015 | Santos, II et al. | |
| 2016/0343293 A1 | 11/2016 | Kim et al. | |
| 2017/0140730 A1 | 5/2017 | Zhang et al. | |

FOREIGN PATENT DOCUMENTS

| | | |
|---|---|---|
| KR | 10-2012-0070921 A | 7/2012 |
| KR | 10-2013-0003217 A | 1/2013 |
| KR | 10-2016-0136642 A | 11/2016 |

OTHER PUBLICATIONS

Chinese Office Action dated Jun. 27, 2022 for Chinese Application No. 201811256169.8.

* cited by examiner

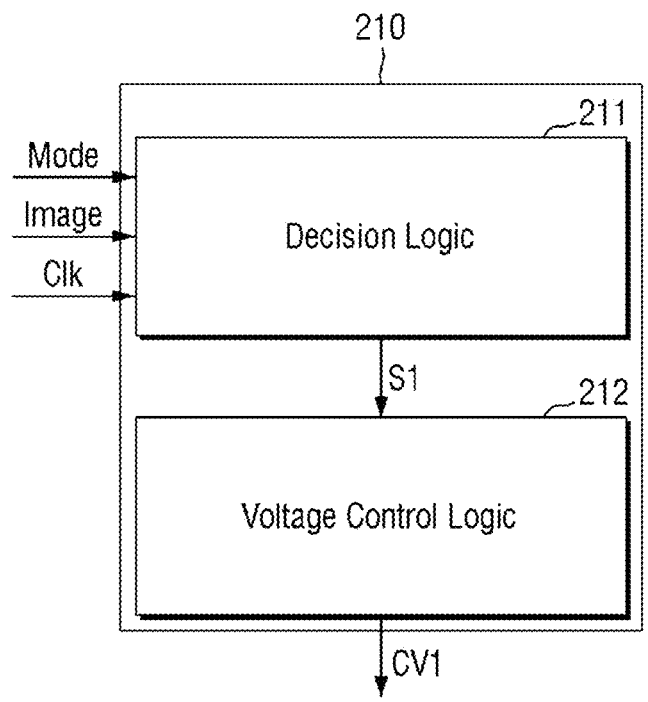

DISPLAY DRIVING CIRCUIT AND DISPLAY DEVICE INCLUDING THE SAME

CROSS-REFERENCE TO RELATED APPLICATION

This application is a continuation application of and claims priority under 35 U.S.C. § 120/121 to U.S. application Ser. No. 16/731,235 filed on Dec. 31, 2019 which is a continuation of U.S. application Ser. No. 15/984,782 filed May 21, 2018, which claims priority from Korean Patent Application No. 10-2017-0143424 filed on Oct. 31, 2017, and Korean Patent Application No. 10-2017-0183761 filed on Dec. 29, 2017, in the Korean Intellectual Property Office, and all the benefits accruing therefrom under 35 U.S.C. 119, the contents of each of which in its entirety are herein incorporated by reference.

BACKGROUND

1. Field of the Invention

Example embodiments relate to a display driving circuit and/or a display device including the same.

2. Description of the Related Art

As the resolution of an organic light-emitting mobile display is enhanced, a gate-count of a digital logic of a display drive integrated circuit (DDI) may increase and the current consumption may increase.

However, the usage patterns of users' mobile phones have changed to a low electric power consumption and a long-term use, like an AOD mode (Always-on-display mode).

SUMMARY

Some example embodiments relate to a display driving circuit which improves the efficiency of electric power consumption by receiving application of a variable voltage.

Other example embodiment relates to a display device including a display driving circuit which improves the efficiency of electric power consumption by receiving the application of the variable voltage.

Example embodiments are not limited to those mentioned above and other example embodiments which is not mentioned can be clearly understood by those skilled in the art from the description below.

According to an example embodiment, there is provided a display driving circuit including a source driver configured to apply source data to a display panel; a power supply configured to receive an external voltage from a power module, and to generate an internal voltage; and processing circuitry configured to, determine whether to change a supply voltage associated with the display driving circuit, the supply voltage including one or more of the internal voltage and the external voltage, and generate a voltage variable signal if the processing circuitry determines to change the supply voltage.

According to an example embodiment, there is provided a display device including a display panel configured to display source data; a power module configured to provide an external voltage to the display device; and a display driving circuit including, a power supply configured to receive an external voltage from the power module to generate an internal voltage, and processing circuitry configured to, determine whether to change the internal voltage generated by the power supply or the external voltage provided to the power supply, and, and transmit the source data and a gate signal to the display panel to drive the display panel.

According to an example embodiment, there is provided a display driving circuit including a source driver configured to apply source data to a display panel, the source data corresponding to image data; a power supply configured to receive an external voltage from a power module to generate an internal voltage; a clock generator configured to generate a clock having a frame frequency; and processing circuitry configured to, receive the internal voltage, the clock and the image data, determine whether to change one or more of the internal voltage and the external voltage based on at least one of a command, the image data, and the frame frequency of the clock, generate a voltage variable signal, if the processing circuitry determines to change one or more of the internal voltage and the external voltage, and change one or more of the internal voltage and the external voltage in response to the voltage variable signal.

BRIEF DESCRIPTION OF THE DRAWINGS

The above and other aspects and features of example embodiments will become more apparent by describing in detail some example embodiments thereof with reference to the attached drawings, in which:

FIG. 3 is a block diagram for explaining the logic unit of FIG. 2 in detail;

FIG. 4 is a table for explaining characteristics of electric power consumption according to operation modes of the display device according to some example embodiments;

DETAILED DESCRIPTION

Hereinafter, a display device according to some example embodiments will be described with reference to FIGS. 1 to 6.

Figure 1:
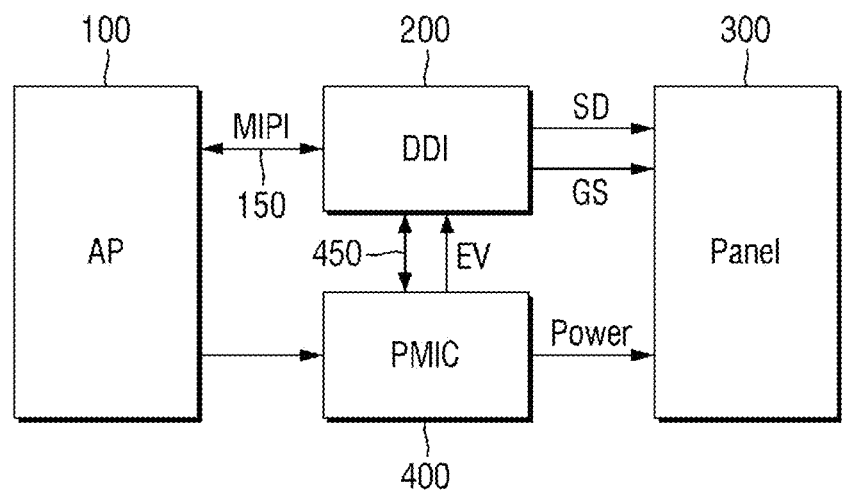
FIG. 1 is a block diagram illustrating a display device according to some example embodiments.
Figure 2:
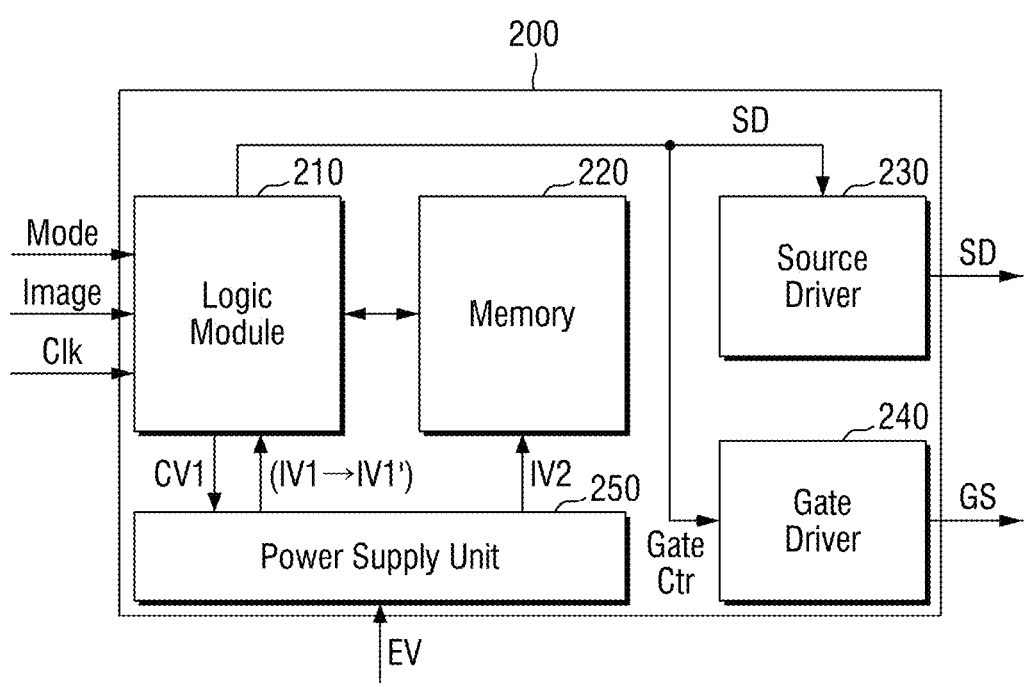
FIG. 2 is a block diagram for explaining the display driving circuit of FIG. 1 in detail.
Figure 5:
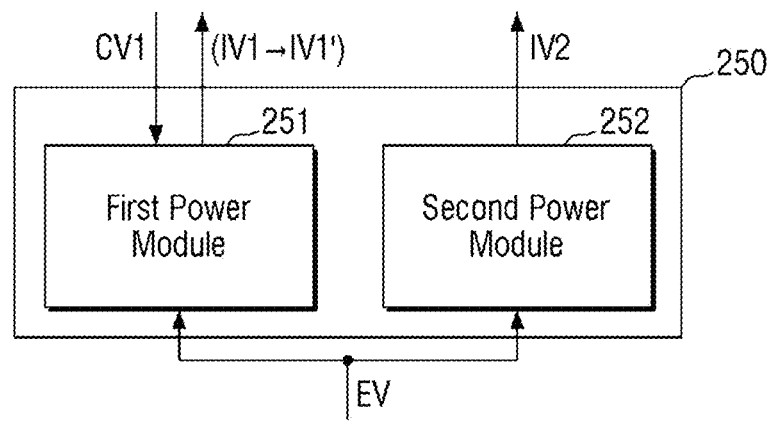
FIG. 5 is a block diagram for explaining a power supply unit of FIG. 2 in detail.
Figure 6:
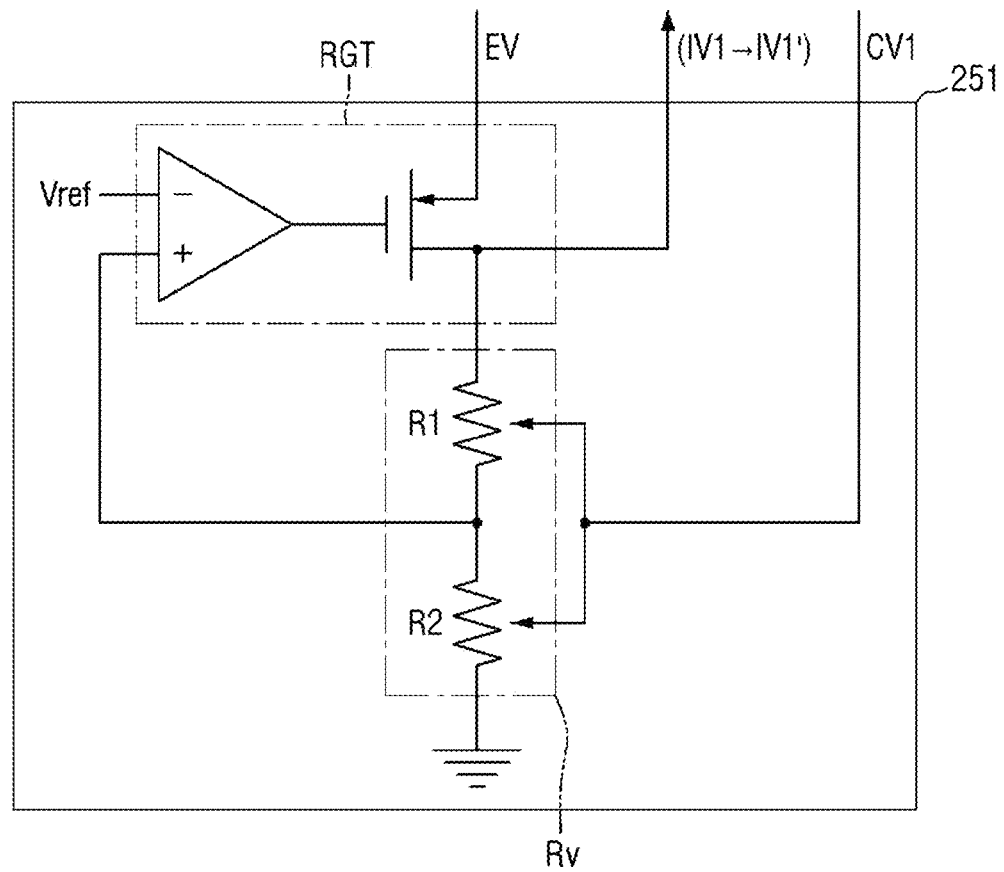
FIG. 6 is a block diagram for explaining a first power supply unit of FIG. 5 in detail.

FIG. 1 is a block diagram illustrating a display device according to some example embodiments, and FIG. 2 is a block diagram for explaining the display driving circuit of FIG. 1 in detail. FIG. 3 is a block diagram for explaining the logic unit of FIG. 2 in detail, and FIG. 4 is a table for explaining characteristics of electric power consumption according to operation modes of the display device according to some example embodiments. FIG. 5 is a block diagram for explaining a power supply unit of FIG. 2 in detail, and FIG. 6 is a block diagram for explaining a first power supply unit of FIG. 5 in detail.

Referring to FIG. 1, a display device according to some example embodiments includes a processor 100, a processor interface 150, a first display driving circuit 200, a display panel 300, a power module 400, and a power interface 450.

The display device may be provided as, for example, a portable electronic device. According to various example embodiments, the first display driving circuit 200 and the display panel 300 may be provided as separate (or external) display devices (or display modules) except for the processor 100.

The processor 100 may control the overall operation of the display device. According to the example embodiment, the processor 100 may be provided as an integrated circuit, a system-on-chip, or a mobile application processor (AP). The processor 100 may transmit data to be displayed (e.g., image data, moving image data, or still image data) to the first display driving circuit 200. According to an example embodiment, the data may be divided into units of source data (SD) corresponding to a horizontal line (or vertical line) of the display panel 300.

The first display driving circuit 200 changes the data transmitted from the processor 100 to a form that can be transmitted to the display panel 300, and may transmit the changed data to the display panel 300. The source data (SD) may be supplied in units of pixels.

Here, the pixel has a structure in which the subpixels Red, Green, and Blue are arranged adjacent to each other in relation to the specified color display, and one pixel may include RGB subpixels (RGB stripe layout structure) or RGGB subpixels (Pentile layout structure). Here, the arrangement structure of the RGGB subpixels may be replaced with the RGBG subpixel arrangement structure. Alternatively, the pixel may be replaced with an RGBW subpixel arrangement structure. However, example embodiments are not limited thereto.

The processor interface 150 may interface signals or data exchanged between the processor 100 and the first display driving circuit 200. The processor interface 150 may interface the source data (SD) (line data) transmitted from the processor 100 and may transmit the source data to the first display driving circuit 200. According to an example embodiment, the processor interface 150 may be an interface related to a serial interface, such as an MIPI (mobile industry processor interface (MIPI®)), a mobile display digital interface (MDDI), a display port, or an embedded display port (eDP).

The display panel 300 may display the source data (SD) by the first display driving circuit 200. According to the example embodiments, the display panel 300 may be provided as a TFT-LCD (thin film transistor-liquid crystal display) panel, an LED (light-emitting diode) display panel, an OLED (organic LED) display panel, an AMOLED (active matrix OLED) display panel, a flexible display panel, or the like.

In the display panel 300, for example, gate lines and source lines may be crossed in a matrix form.

A signal corresponding to the source data (SD) or the source data (SD) itself may be supplied to the source lines. The signal corresponding to the source data (SD) may be in the form of an analog voltage.

The power module 400 may manage the electric power of the display device. According to an example embodiment, the power module 400 may include a PMIC (power management integrated circuit), a charger IC (charger integrated circuit), and/or a battery or fuel gauge.

The power module 400 may have a wired and/or wireless charging mode. The wireless charging mode includes, for example, a magnetic resonance mode, a magnetic induction mode, an electromagnetic method, or the like, and may further include an additional circuit for wireless charging, for example, a coil loop, a resonance circuit, a rectifier, or the like.

The power module 400 may receive commands from the processor 100 to supply electric power to parts of the display device. The power module 400 may supply electric power to the first display driving circuit 200 and the display panel 300, respectively.

Specifically, the power module 400 may provide an external voltage (EV) to the first display driving circuit 200. The external voltage (EV) may be processed and used inside the first display driving circuit 200.

The power interface 450 may interface between the power module 400 and the first display driving circuit 200. Specifically, the power interface 450 may transfer the commands which are sent to the power module 400 by the first display driving circuit 200. Since the power interface 450 exists separately from the processor interface 150, the power interface 450 may be directly connected to the power module 400 from the first display driving circuit 200 without going through the processor 100.

Referring to FIG. 2, the first display driving circuit 200 may include a first logic unit 210, a memory 220, a source driver 230, a gate driver 240, and a first power supply unit 250.

The first logic unit 210 may be referred to as processing circuitry. Although it is not illustrated, the first logic unit 210 may include a memory write controller, a timing controller, a memory read controller, an image processing unit, a source shift register controller, and a data shift register.

The memory write controller of the first logic unit 210 may control the operation of receiving the image data (Image) transmitted from the processor interface 150, and writing the received image data (Image) on the memory 220.

The timing controller of the first logic unit 210 may supply a synchronizing signal and/or a clock signal to each component (e.g., the memory read controller) of the first display driving circuit 200.

Further, the timing controller of the first logic unit 210 may transmit a read command for controlling the read operation of the memory 220 to the memory read controller.

The timing controller may control the supply of the source data (SD) of the source driver 230. Also, the timing controller of the first logic unit 210 may control the output of the gate signal (GS) of the gate driver 240 via a gate control signal (Gate Ctr).

The memory read controller of the first logic unit 210 may execute a read operation on the image data (Image) stored in the memory 220. According to an example embodiment, the memory read controller of the first logic unit 210 may execute a read operation on all or a part of image data (Image) stored in the memory 220, on the basis of a read command of image data (Image).

The memory read controller of the first logic unit 210 may transmit all of the image data (Image), which is read from the memory 220, or a part of the image data (Image) to the image processing unit.

Although the memory write controller and the memory read controller of the first logic unit 210 will be explained separately for convenience of explanation, they may be provided as a single memory controller.

The image processing unit of the first logic unit 210 may process all the image data (Image) transmitted from the memory read controller or a part of the image data (Image) to improve the image quality. The image data (Image) with improved image quality is transferred to the timing controller as source data (SD), and the timing controller may transfer the source data (SD) to the source driver 230.

The source shift register controller of the first logic unit 210 may control a data shifting operation of the data shift register. According to an example embodiment, the source shift register controller may execute controls such as writing of image data (Image) of the memory 220, and video preprocessing of the image processing unit in response to the command received from the processor 100.

The data shift register of the first logic unit 210 is capable of shifting the image data (Image) transmitted through the source shift register controller, that is, the source data (SD), in accordance with the control of the source shift register controller. The data shift register may sequentially transmit the shifted source data (SD) to the source driver 230.

The memory 220 may store the source data (SD) which is input via the memory write controller, in accordance with the control of the memory write controller. The memory 220 may operate as a buffer memory in the first display driving circuit 200. According to an embodiment, the memory 220 may include a graphic random access memory (GRAM).

The source driver 230 may transmit the source data (SD), which is transmitted from the first logic unit 210, to the display panel 300. According to an example embodiment, the source driver 230 may include amplifiers connected for each subpixel (or for each channel assigned to each subpixel). The amplifiers included in the source driver 230 may be driven in units of pixels. For example, the amplifiers included in the source driver 230 may be grouped for each pixel (e.g., RGB subpixels or RGGB subpixels) which is set to output a specified color (e.g., white or black). The source driver 230 may use the output of the amplifier, which is assigned to the specified subpixel in one pixel, by sharing the output of the amplifier with at least another subpixel.

The gate driver 240 may drive the gate lines of the display panel 300. That is, as the operations of the pixels provided on the display panel 300 are controlled by the source driver 230 and the gate driver 240, the source data (SD) which is input from the processor 100 may be displayed on the display panel 300.

The first power supply unit 250 may receive the external voltage (EV) to generate the first internal voltage (IV1) and the second internal voltage (IV2). The first power supply unit 250 may supply the first internal voltage (IV1) to the first logic unit 210. The first power supply unit 250 may supply the second internal voltage (IV2) to the memory 220.

The first power supply unit 250 may receive the first voltage change signal (CV1) from the first logic unit 210. Upon receiving the first voltage change signal (CV1), the first power supply unit 250 changes to the changed first internal voltage (IV1') instead of the first internal voltage (IV1), and supplies the changed first internal voltage (IV1') to the first logic unit 210.

Referring to FIG. 3, the first logic unit 210 may further include a voltage variable determination logic 211 and a first voltage control logic 212.

The voltage variable determination logic 211 may receive the mode signal (Mode), the image data (Image) and the clock (Clk) from the processor 100. The voltage variable determination logic 211 may determine whether the supply voltage of the first logic unit 210 needs to be varied, using at least one of the mode signal (Mode), the image data (Image) and the clock (Clk). At this time, the "supply voltage" may mean the first internal voltage (IV1). The voltage variable determination logic 211 may generate the first voltage variable signal (S1) when it is determined that the power supply voltage needs to be varied.

Referring to FIGS. 3 and 4, the display device may operate in a plurality of modes, and each mode may have different toggle amounts, different OPRs (on-pixel ratio), and different frame frequencies.

The toggle amount means the total number of times the toggling of signals occurs when signals different from adjacent pixels are present in the display panel 300. That is, when the difference in brightness between adjacent pixels is large, the toggle amount may increase. When the toggle amount is large, more electric power may be required.

The OPR may be the ratio of the turn-on pixels among the pixels of the entire display panel 300. As the OPR increases high, the more electric power may be required.

For example, a mode A is a normal mode which may have a specific value of toggle amount, an OPR, and a frame frequency. In contrast, a mode B may have a higher toggle amount, a higher OPR and a higher frame frequency than the mode A. In such a case, in the mode B, a higher supply voltage may be used such that the operation of the display device may be quickly executed. Therefore, in such a case, to vary the supply voltage, the voltage variable determination logic 211 may generate the first voltage variable signal (S1).

Conversely, the mode C may have a lower toggle amount, a lower OPR and a lower frame frequency than the mode A. In such a case, in the mode C, even if a lower power supply voltage is used, the operation of the display device may be executed without problems and electric power consumption may be reduced. Therefore, in such a case, to vary the supply voltage, the voltage variable determination logic 211 may generate the first voltage variable signal (S1).

The mode B and the mode C are merely examples of the operation mode, and the characteristics of each mode are not limited thereto. Also, in each mode, directionality in which the respective characteristics are opposite may be provided. In other words, there may also be a mode in which the toggle amount increases but OPR decreases. In such a case, the voltage variable determination logic 211 comprehensively determines a plurality of characteristics to determine whether or not the power supply voltage is variable, and it is possible to generate the first voltage variable signal (S1) accordingly.

The mode C may be an AOD (Always-On-Display) mode. The AOD mode may be a state which low brightness is maintained but the display is always turned on. For example, the AOD mode may be displayed in the form in which the clock is displayed or the calendar is displayed on the display. However, example embodiments are not limited thereto.

Specifically, the voltage variable determination logic 211 may acquire information on the mode conversions from the mode signal (Mode) of the processor 100. As a result, the voltage variable determination logic 211 may receive the mode signal (Mode) and may determine whether the power supply voltage is variable. That is, the voltage variable determination logic 211 may generate the first voltage variable signal (S1) in accordance with the mode signal (Mode).

Alternatively, since the voltage variable determination logic 211 receives image data (Image) from the processor 100, by determining the characteristics of the toggle amount, OPR and/or average of the most significant bit (MSB) in the image data (Image), the voltage variable determination logic 211 may determine whether the power supply voltage is variable. At this time, the most significant bit may be used in the unit of brightness. That is, the value of the most significant bit may change depending on the brightness of the pixel.

At this time, the determined characteristics are not limited to the toggle amount, the OPR and/or the average of the most significant bit, and the like. That is, the voltage variable determination logic 211 may generate the first voltage variable signal (S1) by comprehensively determining various characteristics of the image data (Image).

Alternatively, the voltage variable determination logic 211 may obtain the clock (Clk) from the processor 100 or another external source. As a result, the voltage variable determination logic 211 may determine whether the power supply voltage is variable on the basis of the frame frequency of the clock (Clk). Here, the frame frequency means the speed at which the display device displays data of one screen, and the display may be performed by the clock (Clk) having the frame frequency. That is, the voltage variable determination logic 211 may generate the first voltage variable signal (S1) in accordance with the frame frequency of the clock (Clk).

As described above, the voltage variable determination logic 211 may generate the first voltage variable signal (S1), using at least one of the mode signal (Mode), the image data (Image), and the frame frequency. That is, instead of using only the respective elements of the mode signal (Mode), the image data (Image) and the frame frequency as the base for determination, by considering two of the mode signal (Mode), the image data (Image) and the frame frequency as a factor, the first voltage variable signal (S1) may be generated. Further, the voltage variable determination logic 211 may generate the first voltage variable signal (S1), on the basis of all of the mode signal (Mode), the image data (Image), and the frame frequency.

Referring again to FIG. 3, the first voltage control logic 212 may receive the first voltage variable signal (S1) from the voltage variable determination logic 211. The first voltage control logic 212 may generate the first voltage change signal (CV1) in accordance with the first voltage variable signal (S1).

Referring to FIG. 5, the first power supply unit 250 may include a first sub power supply unit 251 and a second sub power supply unit 252.

The first sub power supply unit 251 and the second sub power supply unit 252 may generate the first internal voltage (IV1) and the second internal voltage (IV2), respectively. The first sub power supply unit 251 and the second sub power supply unit 252 receive the external voltages EV, and may generate the first internal voltage (IV1) and the second internal voltage (IV2) accordingly.

The first internal voltage (IV1) of the first sub power supply unit 251 may be supplied to the first logic unit 210, and the second internal voltage (IV2) of the second sub power supply unit 252 may be supplied to the memory 220. In some example embodiments, additional sub power supply units which additionally generate an internal voltage to be supplied to other components may be further present.

The first sub power supply unit 251 receives the first voltage change signal (CV1), and may change the first internal voltage (IV1) to the changed first internal voltage (IV1'), accordingly. That is, the first sub power supply unit 251 supplies the first internal voltage (IV1) to the first logic unit 210, and when transmitting the first voltage change signal (CV1) from the first logic unit 210, the first sub power supply unit 251 may supply the changed first internal voltage (IV1') to the first logic unit 210.

Referring to FIG. 6, the first sub power supply unit 251 may include a regulator (RGT) and variable resistance row (Rv).

The regulator (RGT) may output the first internal voltage (IV1), using the external voltage (EV) and the reference voltage (Vref). The regulator (RGT) may output a constantly maintained voltage. At this time, the magnitude of the first internal voltage (IV1) to be output may be adjusted by the variable resistance row (Rv).

The variable resistance row (Rv) may be designed to adjust the position which is in contact with + terminal of the operational amplifier of the regulator (RGT) in the series resistance. As a result, the first voltage change signal (CV1) may adjust the position of the variable resistance row (Rv) which is in contact with the + terminal of the operational amplifier of the regulator (RGT). As a result, the magnitude of the first internal voltage (IV1) may change depending on the ratio of the first resistor R1 and the second resistor R2.

That is, the first voltage change signal (CV1) may be in the form of a mechanical operation of the analog circuit, rather than the output signal of the digital circuit. That is, the first voltage control logic 212 may perform an operation of adjusting the contact of the variable resistance row (Rv), and this may be defined as the first voltage change signal (CV1).

Accordingly, the output of the regulator (RGT) may be changed from the first internal voltage (IV1) to the changed first internal voltage (IV1').

Existing display driving circuits may always driven using a constant voltage. Thus, even when a high voltage is not required, a set constant electric power is consumed. Likewise, even when a higher performance is desired through a relatively higher voltage, the set constant electric power is still consumed.

In contrast, the display device according to some example embodiments can efficiently use the voltage as the internal voltage is controlled as described above. That is, when a higher performance is required at a higher voltage, a higher voltage is supplied to the display driving circuit, and when the display driving circuit is sufficiently drivable at a lower voltage, a lower voltage can be supplied to the display driving circuit without waste.

As a result, the efficiency of entire voltage supply of the display device is enhanced, and undesired power consumption can be reduced.

Hereinafter, a display driving circuit of the display device according to some other example embodiments will be described with reference to FIGS. 7 to 9. The repeated description of the above description will be omitted or simplified.

Figure 7:
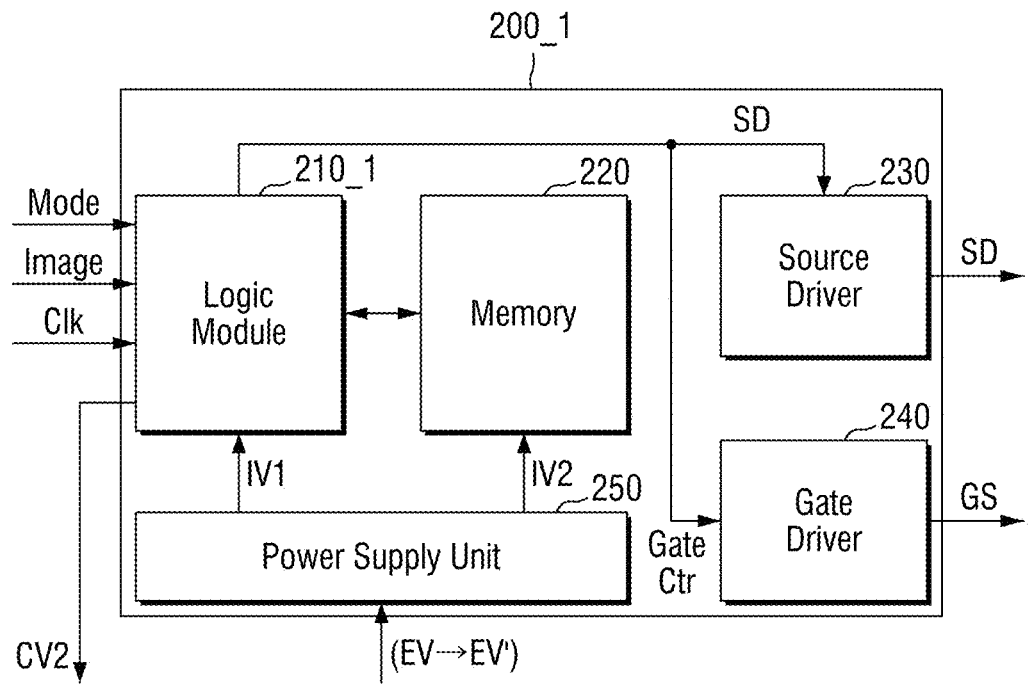
FIG. 7 is a block diagram illustrating the display driving circuit according to some example embodiments.
Figure 8:
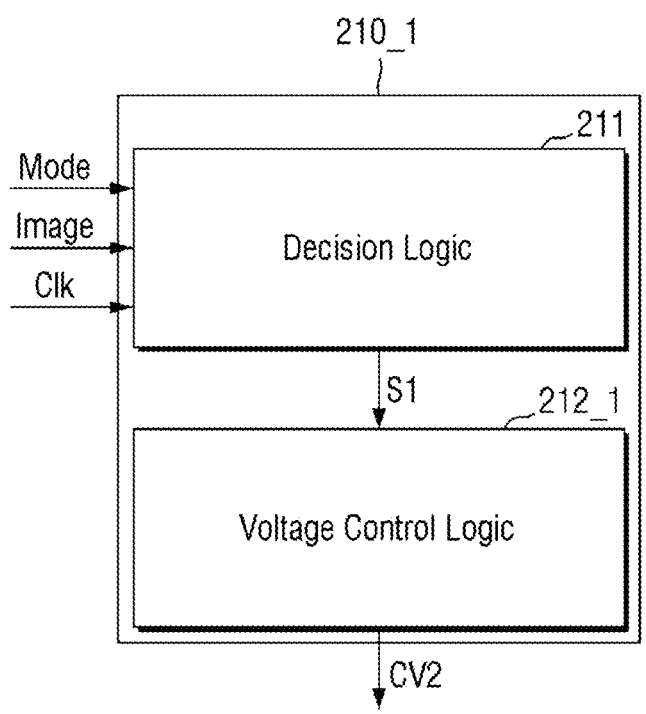
FIG. 8 is a block diagram for explaining the logic unit of FIG. 7 in detail.

FIG. 7 is a block diagram for explaining the display driving circuit according to some example embodiments, and FIG. 8 is a block diagram for explaining the logic unit of FIG. 7 in detail. FIG. 9 is a block diagram for explaining a relation between the display driving circuit and the power module of FIG. 7.

Figure 9:
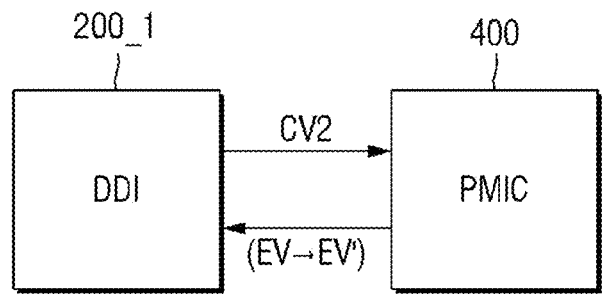
FIG. 9 is a block diagram for explaining a relationship between the display driving circuit and the power module of FIG. 7.

Referring to FIGS. 7 and 9, a second display driving circuit 200_1 of the display device according to some example embodiments includes a second logic unit 210_1.

The second logic unit 210_1 may not transmit the voltage change signal to the first power supply unit 250, and instead may transmit the second voltage change signal (CV2) to the outside of the second display driving circuit 200_1. The second voltage change signal (CV2) may be directly transferred to the power module 400 of FIG. 9. Accordingly, the power module 400 may change the external voltage (EV), which is supplied to the first power supply unit 250, to the changed external voltage (EV').

The first power supply unit 250 may generate the same first internal voltage (IV1) using the changed external voltage (EV'). Therefore, the second logic unit 210_1 is supplied with the same first internal voltage (IV1). However, since the second display driving circuit 200_1 receives the changed external voltage (EV'), the electric power consumption amount may vary.

Referring to FIG. 8, the second logic unit 210_1 may include a second voltage control logic 212_1. The second voltage control logic 212_1 may receive the first voltage variable signal (S1) from the voltage variable determination logic 211. Upon receiving the first voltage variable signal (S1), the second voltage control logic 212_1 may generate the second voltage change signal (CV2) accordingly.

As described above, the second voltage change signal (CV2) may be directly transferred to the power module 400 rather than the first power supply unit 250. The second voltage change signal (CV2) may be, but is not limited to, a digital signal having the form of command.

According to some example embodiments, in the case where the used amount of current may decrease, the same internal voltage may be used, but the changed external voltage EV' may be small to achieve low electric power consumption of the entire display device.

Hereinafter, a display driving circuit of the display device according to some other example embodiments will be described with reference to FIGS. 9 to 11. The repeated description of the above description will be omitted or simplified.

Figure 10:
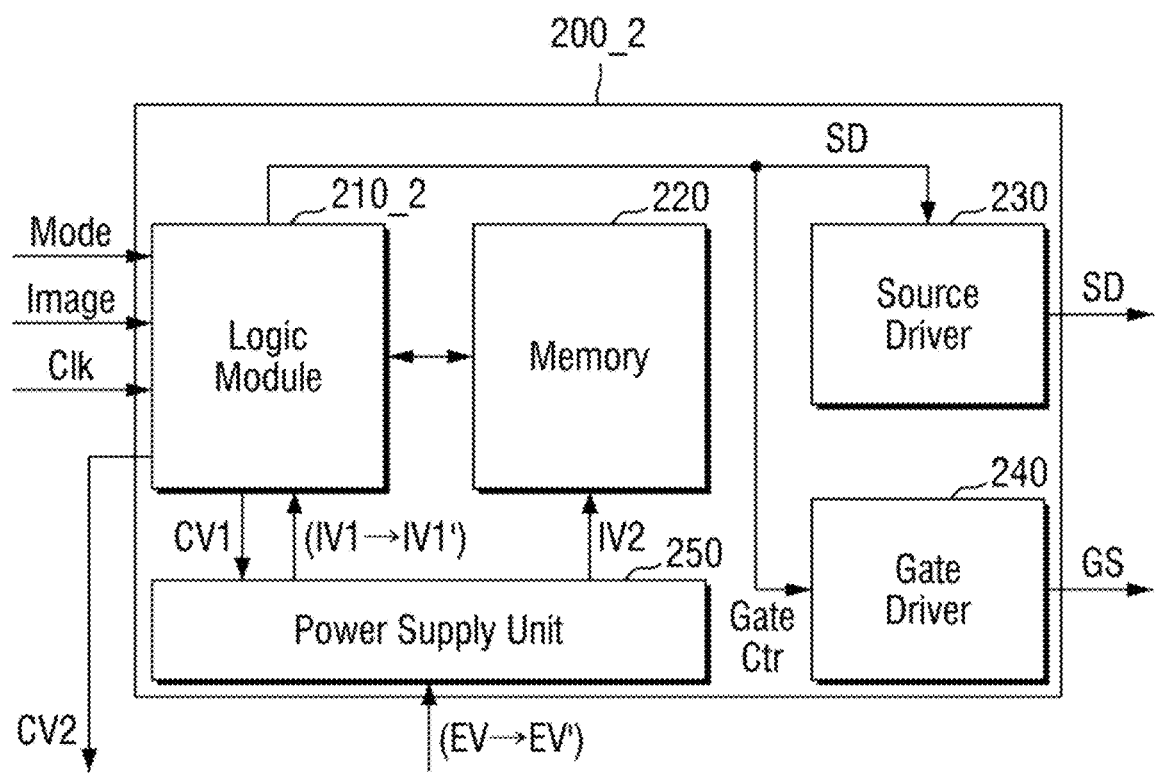
FIG. 10 is a block diagram for explaining a display driving circuit according to some example embodiments.
Figure 11:
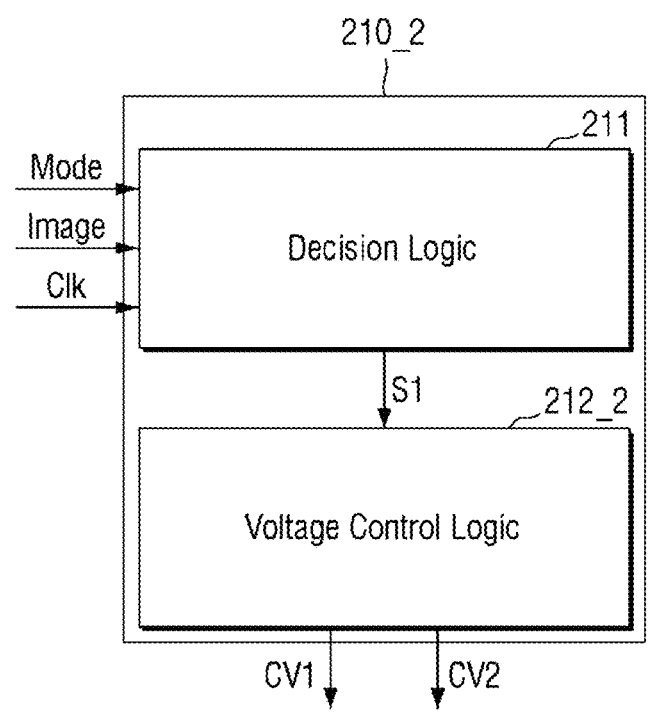
FIG. 11 is a block diagram for explaining the logic unit of FIG. 10 in detail.

FIG. 10 is a block diagram for explaining the display driving circuit according to some embodiments of the present invention, and FIG. 11 is a block diagram for explaining the logic unit of FIG. 10 in detail.

Referring to FIGS. 9 to 11, a third display driving circuit 200_2 of the display device according to some example embodiments includes a third logic unit 210_2.

The third logic unit 210_2 may transmit the first voltage change signal (CV1) to the first power supply unit 250. The first power supply unit 250 may change the first internal voltage (IV1) to the changed first internal voltage (IV1').

The third logic unit 210_2 may also transmit the second voltage change signal (CV2) to the outside of the second display driving circuit 200_1. The second voltage change signal (CV2) may be directly transferred to the power module 400 of FIG. 9. Thus, the power module 400 may change the external voltage (EV), which is supplied to the first power supply unit 250, to the changed external voltage (EV').

The first power supply unit 250 may generate the same first internal voltage (IV1) or the changed first internal voltage (IV1'), using the changed external voltage (EV'). Accordingly, the electric power consumed by the entire third display driving circuit 200_2 varies as the external voltage (EV) is changed to the changed external voltage (EV'), and the electric power consumption consumed by the third logic unit 210_2 may vary as the first internal voltage (IV1) is changed to the changed first internal voltage (IV1').

Referring to FIG. 11, the third logic unit 210_2 may include a third voltage control logic 212_2. The third voltage control logic 212_2 may receive the first voltage variable signal (S1) from the voltage variable determination logic 211. Upon receiving the first voltage variable signal (S1), the third voltage control logic 212_2 may generate a first voltage change signal (CV1) and a second voltage change signal (CV2) accordingly.

As described above, the first voltage change signal (CV1) may be transmitted to the first power supply unit 250, and the second voltage change signal (CV2) may be transferred to the power module 400.

According to some example embodiments, the third display driving circuit 200_2 of the display device may control the internal voltage and the external voltage at the same time, thereby achieving more precise and efficient power consumption.

Hereinafter, a display driving circuit of the display device according to some other example embodiments will be described with reference to FIGS. 1 and 12. The repeated description of the above description will be omitted or simplified.

Figure 12:
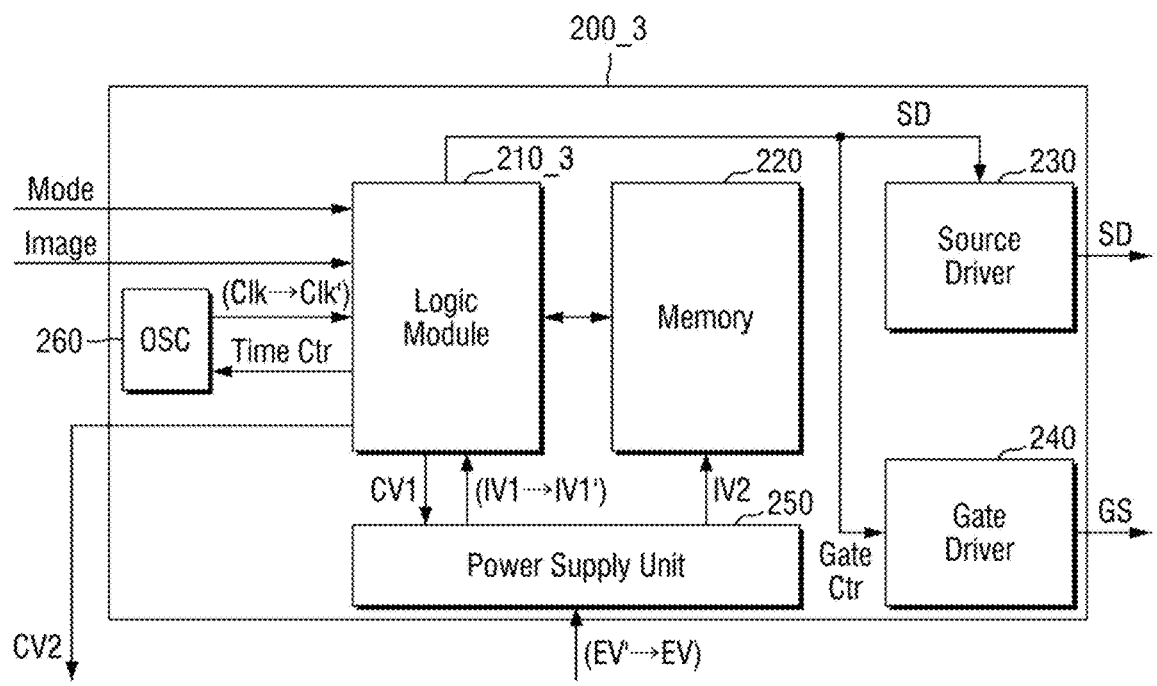
FIG. 12 is a block diagram for explaining the display driving circuit according to some example embodiments.

FIG. 12 is a block diagram illustrating the display driving circuit according to some embodiments of the present invention.

Referring to FIGS. 1 and 12, a fourth display driving circuit 200_3 of the display device according to some example embodiments includes a fourth logic unit 210_3 and a clock generation unit 260.

The clock generation unit 260 may generate the clock (Clk) used in the fourth display driving circuit 200_3. The clock generation unit 260 may supply the clock (Clk) having the frame frequency to the fourth logic unit 210_3.

The fourth logic unit 210_3 may transfer the time control signal (Time Ctr) to the clock generation unit 260. The time control signal (Time Ctr) may be a signal for changing the frame frequency of the clock (Clk). The clock generation unit 260 may generate a changed clock (Clk') obtained by changing the frame frequency of the clock (Clk) in accordance with the time control signal (Time Ctr).

For example, the fourth logic unit 210_3 may receive a command of changing the frame frequency from the processor 100 of FIG. 1. This may be simply in the form of a change signal of the frame frequency and may be in the form of a command of requesting various other operations like a mode signal (Mode).

Therefore, the fourth logic unit 210_3 may transfer the time control signal (Time Ctr) to the clock generation unit 260. Accordingly, the fourth logic unit 210_3 may receive the supply of the changed clock (Clk') having the changed frame frequency from the clock generation unit 260.

As described above, the fourth logic unit 210_3 may generate the first voltage change signal (CV1) and the second voltage change signal (CV2) through at least one of the mode signal (Mode), the image data (Image), and the frame frequency of the clock (Clk). FIG. 12 illustrates a configuration in which the fourth logic unit 210_3 generates both the first voltage change signal (CV1) and the second voltage change signal (CV2), but example embodiments are not limited thereto. That is, in the display driving circuit according to some example embodiments, the fourth logic unit 210_3 may generate one or more of the first voltage change signal (CV1) and the second voltage change signal (CV2).

Hereinafter, a display driving circuit of the display device according to some other example embodiments will be described with reference to FIGS. 1, 13 and 14. The repeated description of the above description will be omitted or simplified.

Figure 13:
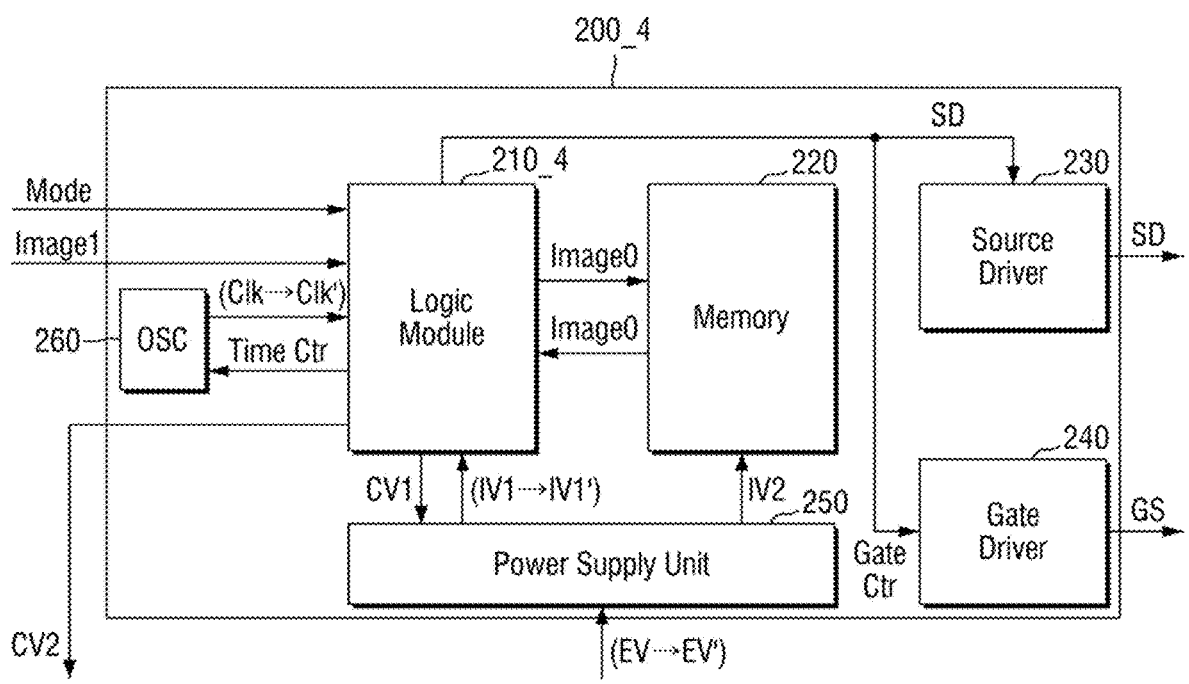
FIG. 13 is a block diagram for explaining the display driving circuit according to some example embodiments.
Figure 14:
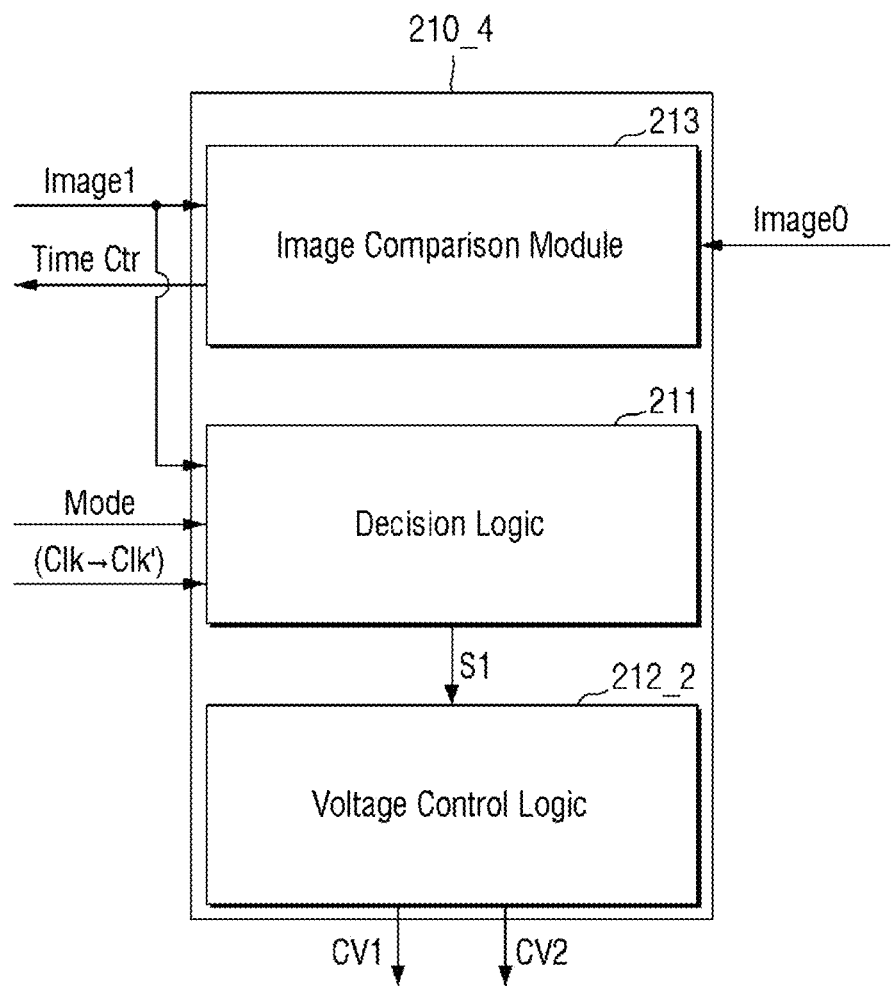
FIG. 14 is a block diagram for explaining the logic unit of FIG. 13 in detail.

FIG. 13 is a block diagram for explaining a display driving circuit according to some example embodiments, and FIG. 14 is a block diagram for explaining the logic unit of FIG. 13 in detail.

Referring to FIGS. 1 and 13, a fifth display driving circuit 200_4 of the display device according to some example embodiments includes a fifth logic unit 210_4.

The fifth logic unit 210_4 transmits the storage image data (Image 0) previously received from the processor 100 to the memory 220, and the memory 220 may store the received storage image data (Image 0). Thereafter, the memory 220 may transmit the storage image data (Image 0) to the fifth logic unit 210_4.

The fifth logic unit 210_4 may separately receive the first image data (Image 1) and the mode signal (Mode) from the processor 100. The storage image data (Image 0) may be image data associated with a previous frame, and the first image data (Image 1) may be image data associated with a current frame. The previous frame and the current frame may be consecutive frames.

Referring to FIGS. 13 and 14, the fifth logic unit 210_4 may include an image comparison module 213.

The image comparison module 213 may receive the storage image data received from the memory 220, and the first image data (Image 1) received from the processor 100. The image comparison module 213 may compare the storage image data (Image 0) and the first image data (Image 1) with each other to determine similarity.

When it is determined that the storage image data (Image 0) and the first image data (Image 1) are similar to each other in a certain portion or more, the image comparison module 213 may transmit the time control signal (Time Ctr) to the clock generation unit 260. Upon receiving the time control signal (Time Ctr), the clock generation unit 260 may change the frame frequency of the clock (Clk) to generate the changed clock (Clk'). The clock generation unit 260 may transmit the changed clock (Clk') to the fifth logic unit 210_4.

When processing an image having a pattern similar to that of the previous image, even if the frame frequency becomes lower, the whole speed does not drop and is sufficient. Thus, this is for the purpose of efficiently using the resource. That is, even when a clock (Clk) corresponding to a lower frame frequency is used, since the amount of calculation is small, the display device may maintain the same level of performance. As a result, the display device of this embodiment may achieve lower power consumption with the same level of performance.

As described above, the fifth logic unit 210_4 may generate the first voltage change signal (CV1) and the second voltage change signal (CV2) through at least one of the mode signal (Mode), the image data (Image), and the frame frequency of the clock (Clk). That is, even when the frame frequency becomes lower due to the similarity of the image, the fifth logic unit 210_4 may vary the voltage on the basis of this.

FIG. 13 illustrates a configuration in which the fifth logic unit 210_4 generate both the first voltage change signal (CV1) and the second voltage change signal (CV2), but example embodiments are not limited thereto. That is, in the display driving circuit according to some example embodiments, the fifth logic unit 210_4 may generate one of the first voltage change signal (CV1) and the second voltage change signal (CV2).

Hereinafter, a display driving circuit of the display device according to some other example embodiments will be described with reference to FIGS. 9, and 15 to FIG. 17. The repeated description of the above description will be omitted or simplified.

Figure 15:
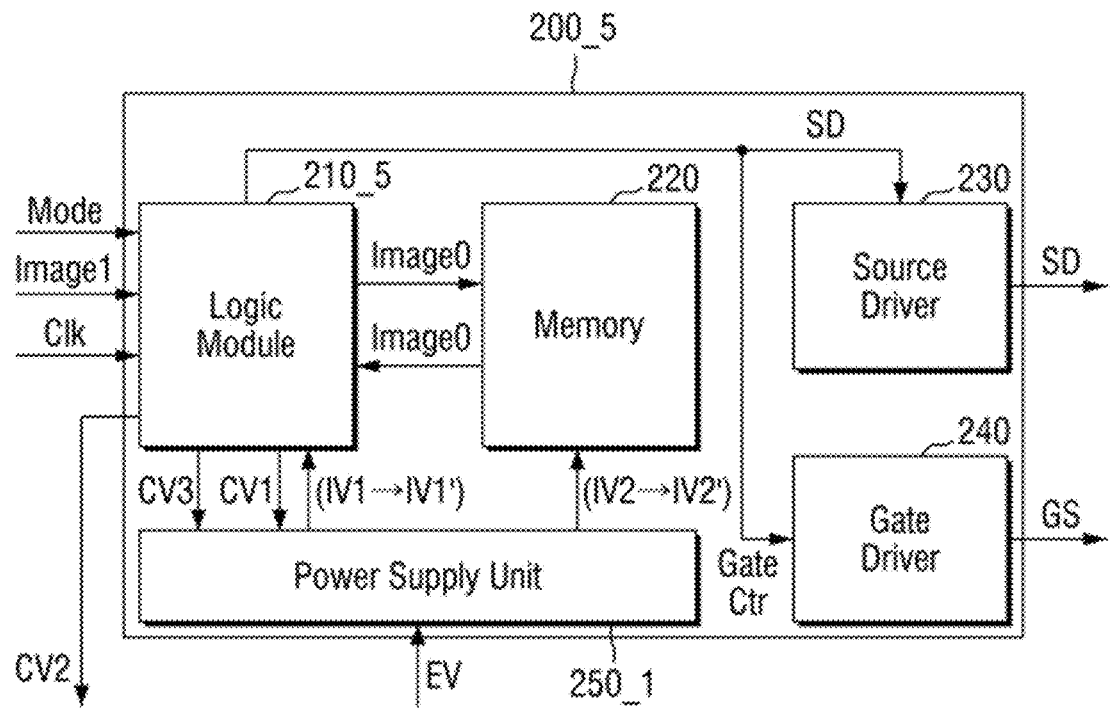
FIG. 15 is a block diagram for explaining the display driving circuit according to some example embodiments.
Figure 16:
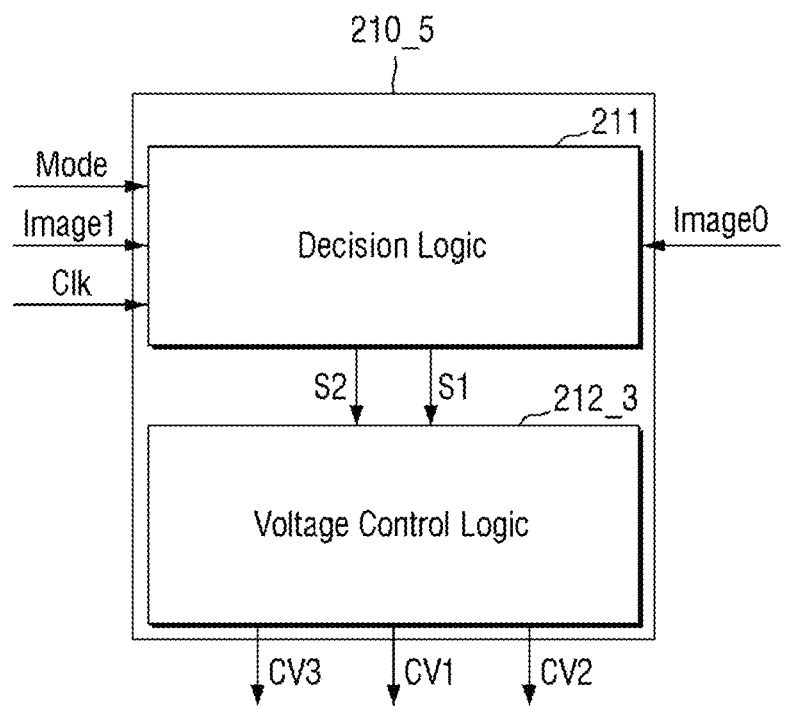
FIG. 16 is a block diagram for explaining the logic unit of FIG. 15 in detail.
Figure 17:
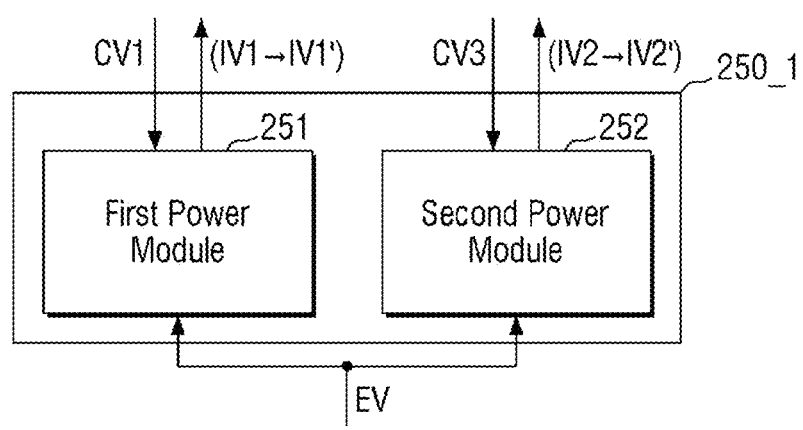
FIG. 17 is a block diagram for explaining the power supply unit of FIG. 15 in detail.

FIG. 15 is a block diagram for explaining the display driving circuit according to some example embodiments, and FIG. 16 is a block diagram for explaining the logic unit of FIG. 15 in detail. FIG. 17 is a block diagram for explaining the power supply unit of FIG. 15 in detail.

Referring to FIGS. 9 and 15 to 17, a sixth display driving circuit 200_5 of the display device according to some example embodiments includes a sixth logic unit 210_5 and a second power supply unit 250_1.

The sixth logic unit 210_5 transmits the storage image data (Image 0) previously received from the processor 100 to the memory 220, and the memory 220 may store the received storage image data (Image 0). Thereafter, the memory 220 may transmit the storage image data (Image 0) to the sixth logic unit 210_5 again.

The sixth logic unit 210_5 may separately receive the first image data (Image 1) and the mode signal (Mode) from the processor 100. Further, the sixth logic unit 210_5 may also receive the clock (Clk) from the processor 100, but example embodiments are not limited thereto. The sixth display driving circuit 200_5 of the display device according to some example embodiments may include a clock generation unit that provides the clock (Clk) to the sixth logic unit 210_5. That is, in this case, the sixth logic unit 210_5 may receive the clock (Clk) through the clock generation unit.

The sixth logic unit 210_5 may transmit the first voltage change signal (CV1) and the third voltage change signal (CV3) to the second power supply unit 250_1. In addition, the sixth logic unit 210_5 may transmit the second voltage change signal (CV2) to the power module 400. FIG. 15 illustrates a configuration in which the sixth logic unit 210_5 generates the first voltage change signal (CV1), the second voltage change signal (CV2) and the third voltage change signal (CV3), but example embodiments are not limited thereto. In the display driving circuit of the display device according to some example embodiments, the display driving circuit 200_5 may generate one or more of the first voltage change signal (CV1), the second voltage change signal (CV2), and the third voltage change signal (CV3).

The sixth logic unit 210_5 includes a voltage variable determination logic 211 and a fourth voltage control logic 212_3.

The voltage variable determination logic 211 may receive the mode signal (Mode), the first image data (Image 1), and the clock (Clk) from the processor 100, and may receive the storage image data (Image 0) from the memory 220.

The voltage variable determination logic 211 may determine whether to vary the supply voltage of the sixth logic unit 210_5, using at least one of the mode signal (Mode), the first image data (Image 1), and the clock (Clk). The "supply voltage" may include a first internal voltage (IV1) and/or an external voltage (EV). The voltage variable determination logic 211 may generate the first voltage variable signal (S1) if the voltage variable determination logic 211 determines to vary the power supply voltage.

Further, the voltage variable determination logic 211 may determine whether to vary the supply voltage of the memory 220, using at least one of the first image data (Image 1) and the storage image data (Image 0). The "supply voltage" may include a second internal voltage (IV2) and/or an external voltage (EV). The voltage variable determination logic 211 may generate the second voltage variable signal (S2) if the voltage variable determination logic 211 determines to vary the power supply voltage.

The fourth voltage control logic 212_3 may receive the first voltage variable signal (S1) from the voltage variable determination logic 211. The fourth voltage control logic 212_3 may generate the first voltage change signal (CV1) and the second voltage change signal (CV2) in accordance with the first voltage variable signal (S1).

Also, the fourth voltage control logic 212_3 may receive the second voltage variable signal (S2) from the voltage variable determination logic 211. The fourth voltage control logic 212_3 may generate the third voltage change signal (CV3) in accordance with the second voltage variable signal (S2).

The second power supply unit 250_1 may include a first sub power supply unit 251 and a second sub power supply unit 252. The first internal voltage (IV1) of the first sub power supply unit 251 may be supplied to the first logic unit 210, and the second internal voltage (IV2) of the second sub power supply unit 252 may be supplied to the memory 220.

The first sub power supply unit 251 receives the first voltage change signal (CV1), thereby changing the first internal voltage (IV1) to the changed first internal voltage (IV1'). That is, the first sub power supply unit 251 supplies the first internal voltage (IV1) to the sixth logic unit 210_5, and when the first voltage change signal (CV1) is transmitted from the sixth logic unit 210_5, the first sub power supply unit 251 may supply the changed first internal voltage (IV1') to the sixth logic unit 210_5.

The second sub power supply unit 252 receives the third voltage change signal (CV3), thereby changing the second internal voltage (IV2) to the changed second internal voltage (IV2'). That is, the second sub power supply unit 252 supplies the second internal voltage (IV2) to the memory 220, and when the third voltage change signal (CV3) is transmitted from the sixth logic unit 210_5, the second sub power supply unit 252 may supply the changed second internal voltage (IV2') to the memory 220.

The first voltage change signal (CV1) and the third voltage change signal (CV3) may be in the form of a mechanical operation of the analog circuit, rather than the output signal of the digital circuit. That is, the fourth voltage control logic 212_3 may perform the operation of adjusting the contact point of the variable resistance row of the first sub power supply unit 251 and the second sub power supply unit 252, and this may be defined as the first voltage change signal (CV1) and the third voltage change signal (CV3), respectively.

In some example embodiments, not only the supply voltage of the logic unit of the display driving circuit but also the supply voltage of the memory can be varied. Therefore, the efficiency of the electric power consumption of the entire display driving circuit can be maximized.

While example embodiments of the inventive concepts have been particularly shown and described with reference to some example embodiments thereof, it will be understood by those of ordinary skill in the art that various changes in form and details may be made therein without departing from the spirit and scope of the example embodiments of the inventive concepts as defined by the following claims. It is therefore desired that the example embodiments be considered in all respects as illustrative and not restrictive, reference being made to the appended claims rather than the foregoing description to indicate the scope of the example embodiments.

According to one or more example embodiments, the units and/or devices described above, such as the components of the display driver 200_1 to 200_5 including the logic units 210_1 to 210_5, the power modules 250 and 250_1 and the clock generating unit 260 and the sub-components of each of the above, may be implemented using hardware, a combination of hardware and software, or a non-transitory storage medium storing software that is executable to perform the functions of the same.

Hardware may be implemented using processing circuitry such as, but not limited to, one or more processors, one or more Central Processing Units (CPUs), one or more controllers, one or more arithmetic logic units (ALUs), one or more digital signal processors (DSPs), one or more microcomputers, one or more field programmable gate arrays (FPGAs), one or more System-on-Chips (SoCs), one or more programmable logic units (PLUs), one or more microprocessors, one or more Application Specific Integrated Circuits (ASICs), or any other device or devices capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, etc., capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., one or more processors, CPUs, controllers, ALUs, DSPs, microcomputers, microprocessors, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor. In another example, the hardware device may be an integrated circuit customized into special purpose processing circuitry (e.g., an ASIC).

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Software and/or data may be embodied permanently or temporarily in any type of storage media including, but not limited to, any machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including tangible or non-transitory computer-readable storage media as discussed herein.

Storage media may also include one or more storage devices at units and/or devices according to one or more example embodiments. The one or more storage devices may be tangible or non-transitory computer-readable storage media, such as random access memory (RAM), read only memory (ROM), a permanent mass storage device (such as a disk drive), and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the storage media, the computer programs, program code, instructions, or some combination thereof, may be specially designed and constructed for the purposes of the example embodiments, or they may be known devices that are altered and/or modified for the purposes of example embodiments.

What is claimed is:

1. A display driving circuit comprising:
a source driver configured to apply source data to a display panel;
a power supply circuitry configured to generate a first internal voltage; and
a processing circuitry configured to receive the first internal voltage, to determine whether to change the first internal voltage, and to output a first voltage change signal when the processing circuitry determines to change the first internal voltage,
wherein the power supply circuitry is configured to supply a changed first voltage different from the first internal voltage to the processing circuitry in response to the voltage change signal.

2. The display driving circuit of claim 1, wherein the processing circuitry is configured to determine whether to change the first internal voltage based on at least one of a mode signal, an image data, and a clock.

3. The display driving circuit of claim 2, wherein the display driving circuit operates in a plurality of modes including a normal mode and a low power mode in response to the at least one of the mode signal, the image data, and the clock.

4. The display driving circuit of claim 3, wherein the low power mode is an always-on-display mode in which the display panel is always turned on with maintaining low brightness.

5. The display driving circuit of claim 3, further comprises a memory configured to receive a second internal voltage from the power supply circuitry.

6. The display driving circuit of claim 5, wherein the power supply circuitry is configured to supply a changed second internal voltage to the memory in response to the voltage change signal.

7. The display driving circuit of claim 6, wherein the power supply circuitry comprises a first power module configured to supply the first internal voltage and a second power module configured to output the second internal voltage.

8. The display driving circuit of claim 7, wherein the processing circuitry comprises a voltage variable determination logic configured to determine whether to change the first internal voltage and a first voltage control logic configured to generate the first voltage change signal.

9. The display driving circuit of claim 1, wherein the power supply circuitry receives an external voltage and generates the first internal voltage from the external voltage.

10. The display driving circuit of claim 9, wherein the power supply circuitry outputs a second voltage change signal when the processing circuitry determines to change the external voltage.

11. The display driving circuit of claim 1, further comprises a clock generating circuit configured to generate a clock for operating the display driving circuit,
wherein the processing circuitry generates and outputs a time control signal, and
wherein the clock generating circuit receives the time control signal, changes a frame frequency of the clock based on the time control signal and outputs the changed clock to the processing circuitry.

12. A display driving circuit comprising:
a power supply circuitry configured to receive an external voltage and generate at least one internal voltage; and
a processing circuitry configured to receive a first internal voltage from the power supply circuitry and output at least one voltage change signal when the processing circuitry determines to change the at least one internal voltage,
wherein the power supply circuitry is configured to generate at least one changed internal voltage different from the generated internal voltage in the power supply circuitry in response to the at least one voltage change signal.

13. The display driving circuit of claim 12, further comprising:
a memory configured to receive a second internal voltage from the power supply circuitry.

14. The display driving circuitry of claim 13, wherein the processing circuitry is configured to,
    determine whether to change at least one of the first internal voltage, the external voltage or the second internal voltage, and
    output at least one of first to third voltage change signals corresponding to the determination.

15. The display driving circuitry of claim 13, wherein the processing circuitry comprises:
    a voltage variable determination logic configured to determine whether to change at least one of the first internal voltage, the external voltage or the second internal voltage, and
    a first voltage control logic configured to generate corresponding to the determination.

16. The display driving circuitry of claim 14, wherein the power supply circuitry is configured to supply the changed first internal voltage to the processing circuitry in response to the first voltage change signal.

17. The display driving circuitry of claim 14, wherein the power supply circuitry is configured to receive the changed external voltage in response to the second voltage change signal.

18. The display driving circuitry of claim 14, wherein the power supply circuitry is configured to supply the changed second internal voltage to the memory in response to the third voltage change signal.

19. The display driving circuit of claim 14, wherein the power supply circuitry comprises,
    a first power module configured to supply the first internal voltage to the processing circuitry based on the first voltage change signal, and
    a second power module configured to supply the second internal voltage to the memory based on the third voltage change signal.

20. The display driving circuit of claim 16, further comprising:
    a clock generating circuit configured to generate a clock for operating the display driving circuit,
    wherein the processing circuitry receive a stored image data from the memory and an input image data from a processor, compare the input image data with the stored image data, and output a time control signal in response to a comparison result, and
    wherein the clock generating circuit changes a frame frequency of the clock based on the time control signal and outputs the changed clock to the processing circuitry.

* * * * *